United States Patent
Ku et al.

(10) Patent No.: US 7,489,170 B2
(45) Date of Patent: Feb. 10, 2009

(54) DELAY LOCKED LOOP IN SYNCHRONOUS SEMICONDUCTOR MEMORY DEVICE AND DRIVING METHOD THEREOF

(75) Inventors: Young-Jun Ku, Kyoungki-do (KR); Seok-Cheol Yoon, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 11/528,644

(22) Filed: Sep. 28, 2006

(65) Prior Publication Data

US 2007/0069783 A1  Mar. 29, 2007

(30) Foreign Application Priority Data

Sep. 29, 2005 (KR) .............. 10-2005-0090906
May 31, 2006 (KR) .............. 10-2006-0049128

(51) Int. Cl.
*H03L 7/06* (2006.01)

(52) U.S. Cl. ....................... 327/158; 327/149
(58) Field of Classification Search .............. None
See application file for complete search history.

(56) References Cited

U.S. PATENT DOCUMENTS

| | | | |
|---|---|---|---|
| 6,525,578 B2 * | 2/2003 | Ooishi | 327/156 |
| 6,525,988 B2 | 2/2003 | Ryu et al. | |
| 6,677,791 B2 * | 1/2004 | Okuda et al. | 327/158 |
| 6,836,437 B2 | 12/2004 | Li et al. | |
| 7,046,061 B2 * | 5/2006 | Kwak | 327/158 |
| 2003/0052719 A1 * | 3/2003 | Na | 327/158 |
| 2004/0212406 A1 | 10/2004 | Jung | |
| 2006/0020835 A1 | 1/2006 | Samson et al. | |
| 2007/0085581 A1 * | 4/2007 | Ku | 327/158 |

FOREIGN PATENT DOCUMENTS

| | | |
|---|---|---|
| KR | 10-2003-0092506 A | 12/2003 |
| KR | 10-2004-0100249 A | 12/2004 |
| KR | 10-2005-0013737 A | 2/2005 |

OTHER PUBLICATIONS

Korean Office Action, with Partial English Translation, issued in Corresponding Korean Patent Application No. KR 10-2006-0049128, dated on Jul. 30, 2007.

* cited by examiner

*Primary Examiner*—Cassandra Cox
(74) *Attorney, Agent, or Firm*—McDermott Will & Emery LLP

(57) ABSTRACT

A semiconductor memory device including a delay locked loop can minimize current consumption during a precharge power down mode. The delay locked loop includes a buffer control block for generating a clock buffer enable signal in response to first and second signals, wherein the first signal represents a precharge power down mode and the second signal represents a reset of the delay locked loop, a clock buffering block, controlled by the clock buffer enable signal, for buffering an external clock to generate a reference clock, and a feedback loop for delaying the reference clock until a delay locking state to thereby output a DLL output clock.

14 Claims, 3 Drawing Sheets

DELAY LOCKED LOOP IN SYNCHRONOUS SEMICONDUCTOR MEMORY DEVICE AND DRIVING METHOD THEREOF

FIELD OF INVENTION

This application claims the benefit of Korean Patent Application No. 2005-0090906, filed Sep. 29, 2005; and Korean Patent Application No. 2006-0049128, filed May 31, 2006, which are hereby incorporated by reference.

BACKGROUND

Recently, a main issue for developing a semiconductor memory device is changed from integration scale to operation speed. Synchronous semiconductor memory devices such as a double data rate synchronous dynamic random access memory (DDR SDRAM) or a RAMBUS DRAM comes into the spotlight for a high speed semiconductor memory device.

The synchronous semiconductor memory device performs an operation in synchronization with a system clock. A SDRAM is considered as a mainstream in a memory market for a synchronous memory device. The SDRAM performs an operation for a data access in response to rising edge of the system clock. The SDRAM performs one data access every one cycle of the external system clock. Alternatively, the DDR SDRAM performs an operation for a data access in response to rising edge and falling edge of the system clock. The SDRAM performs two data accesses every one cycle of the external system clock.

Generally, the system clock is used as a reference signal for performing operation or adjusting or controlling operating timing in a system or a circuit including semiconductor devices. Also, the system clock is used as a reference signal to guarantee a high-speed operation without error.

When internal circuits of a semiconductor memory device use an external system clock input, the system clock is transferred to the internal circuits with delay, i.e. clock skew, caused by the clock transmission path. To compensate the delay, a synchronizing circuit such as a phase locked loop (PLL) or a DLL are widely used in a semiconductor memory device. Since the DLL has a greater advantage for noise from the PLL, the DLL is broadly used in the synchronous semiconductor memory device including the DDR SDRAM. The DLL in the synchronous semiconductor memory device receives a system clock and compensates a clock skew caused by a clock path in the semiconductor memory device to synchronize an output timing of a data with the transition of the system clock.

FIG. 1 is a block diagram of a delay locked loop (DLL) in a conventional DDR SDRAM.

As shown, the delay locked loop includes first and second clock buffers 110 and 120, first and second delay lines 130 and 140, a phase comparator 170, a delay line controller 180, a delay model circuit 190, and first and second DLL buffers 150 and 160.

The first clock buffer 110 receives a clock bar signal/CLK to generate a first internal clock fclkt2 in response to a clock enable signal cke, and the second clock buffer 120 receives a clock signal CLK to generate a second internal clock rclkt2. The first internal clock fclkt2 is input to the first delay line 130 and the second internal clock rclkt2 is input to the second delay line 140, respectively.

The delay model circuit 190 delays an output of the second delay line 140 by a predetermined amount estimated from a clock path and data path where data or the clock signal passes on in the semiconductor memory device. The phase comparator 170 compares phases of the second internal clock rclkt2 and output of the delay model circuit 190. The delay line controller 180 determines each delay amount of the first and second delay lines 130 and 140 in response to the comparison result of the phase comparator 170.

Output of the first delay line 130 is input to the first DLL driver 150 and supplied to the semiconductor memory device as a first DLL clock fclk_dll. Likewise, output of the second delay lines 140 is input to the second DLL driver 160 and supplied as a second DLL clock rclk_dll.

The delay model circuit 190 includes a dummy clock buffer, a dummy output buffer, a dummy load, and the like in order to implement a delay condition that is the same as a clock path in the semiconductor memory device. Generally, the delay model circuit 190 is known as a replica circuit.

Hereinafter, detailed operation of the DLL for use in the conventional DDR SDRAM is described.

First, the first clock buffer 110 receives a rising edge of the clock bar signal/CLK to generate the first internal clock fclkt2, and the second clock buffer 120 receives a rising edge of the clock signal CLK to generate the second internal clock rclkt2. Herein, the first and second internal clocks fclkt2 and rclkt2 are in the shape of pulse.

At an initial operation, the second internal clock rclkt2 passes through the second delay line 140 having an initial delay amount and the delay model circuit 190 having a predetermined delay amount. That is, after delayed by the second delay line 140 and the delay model circuit 190, the second internal clock rclkt2 is converted into a feedback clock fb_clk.

The phase comparator 170 compares a phase of the second internal clock rclkt2, used as a reference signal, with that of the feedback clock fb_clk output from the delay model circuit 190 to thereby output the comparison result. In response to an output signal of the phase comparator 170, the delay controller 180 controls delay amounts of the first and second delay lines 130 and 140.

Thereafter, the phase comparator 170 compares a phase of the second internal clock rclkt2 with that of the feedback clock fb_clk having a controlled delay amount based on the comparison result, periodically. When there is a minimum jitter between the second internal clock rclkt2 and the feedback clock fb_clk, a delay locking state of the DLL is accomplished.

The first clock buffer 110 of the DLL is controlled by the clock enable signal cke. That is, in a precharge power-down mode during which the clock enable signal CKE is inactivated as a logic level low, the first clock buffer 110 is disabled although the second clock buffer 120 is enabled. As a result, power consumption caused by unnecessary toggling of the first internal clock fclkt2 is decreased.

For minimizing current consumption of the DLL during the precharge power-down mode, it is preferred that the second clock buffer 120 is also turned off. However, if the second clock buffer 120 is turned off during the precharge power-down mode, operation reliability of the semiconductor memory device cannot be guaranteed. If a precharge power down mode starts before 200 clock cycles after a self refresh operation is terminated (herein, 200 clock cycles is generally required for a delay locking state of the DLL), the delay locking state is not achieved and the second clock buffer 120 for generating a reference clock is turned off; finally, after 200 clock cycles after the self refresh operation is terminated, the DLL included in the semiconductor memory device cannot achieve the delay locking state.

Therefore, during the precharge power down mode, the second clock buffer 120 should be turned on; accordingly, current consumption of the DLL during the precharge power-down mode is not decreased.

SUMMARY OF THE INVENTION

It is an object of the present invention to provide a semiconductor memory device including a delay locked loop and operation method thereof, which can minimize a current consumption during a precharge power down mode.

In accordance with an aspect of the present invention, there is provided a delay locked loop, including a buffer control block for generating a clock buffer enable signal in response to first and second signals, wherein the first signal represents a precharge power down mode and the second signal represents a reset of the delay locked loop, a clock buffering block, controlled by the clock buffer enable signal, for buffering an external clock to generate a reference clock, and a feedback loop for delaying the reference clock until a delay locking state, to thereby output a DLL output clock.

In accordance with another aspect of the present invention, there is provided a delay locked loop, including a buffer control block for generating a clock buffer enable signal in response to a clock enable signal and a fast mode signal, a first clock buffering block, controlled by the clock enable signal, for buffering a first external clock to generate a reference clock, a second clock buffering block, controlled by the clock enable signal, for buffering a second external clock to generate an internal clock, and a feedback loop for delaying the reference clock until a delay locking state to thereby output a DLL output clock, wherein the feedback loop generates the clock enable signal and the fast mode signal.

In accordance with another aspect of the present invention, there is provided a semiconductor memory device, including a buffer control block for generating a clock buffer enable signal in response to first and second signals, wherein the first signal represents a precharge power down mode and the second signal represents a reset of the delay locked loop, and a delay locked loop including a clock buffering block controlled by the clock buffer enable signal.

BRIEF DESCRIPTION OF THE DRAWINGS

The above and other objects and features of the present invention will become better understood with respect to the following description of the specific embodiments given in conjunction with the accompanying drawings, in which.

DETAILED DESCRIPTION OF THE INVENTION

Hereinafter, a delayed locked loop in accordance with specific embodiments of the present invention will be described in detail with reference to the accompanying drawings. A delay locked loop (DLL) according to the present invention particularly provides to a semiconductor memory device and a system requiring a delay locking function.

Figure 2:
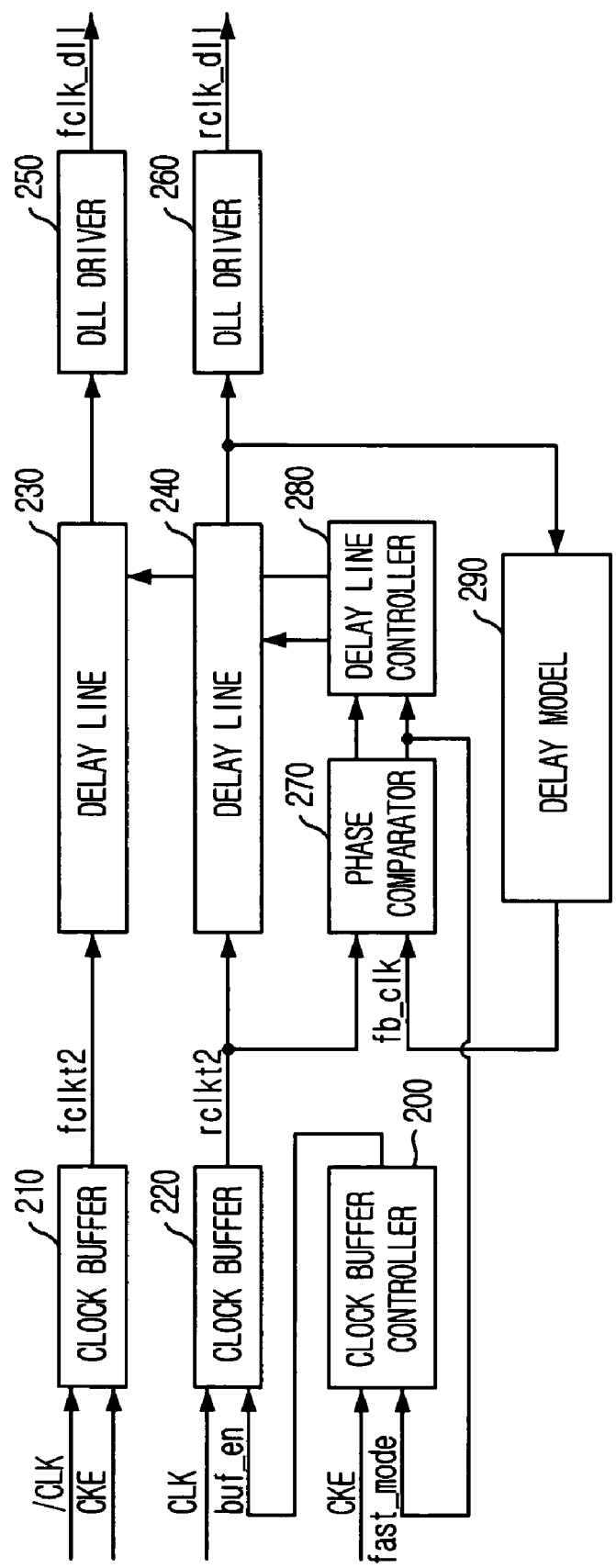
FIG. 2 is a block diagram of a delay locked loop in a DDR SDRAM in accordance with the present invention.

FIG. 2 is a block diagram of a delay locked loop (DLL) in a DDR SDRAM in accordance with the present invention.

Figure 1:
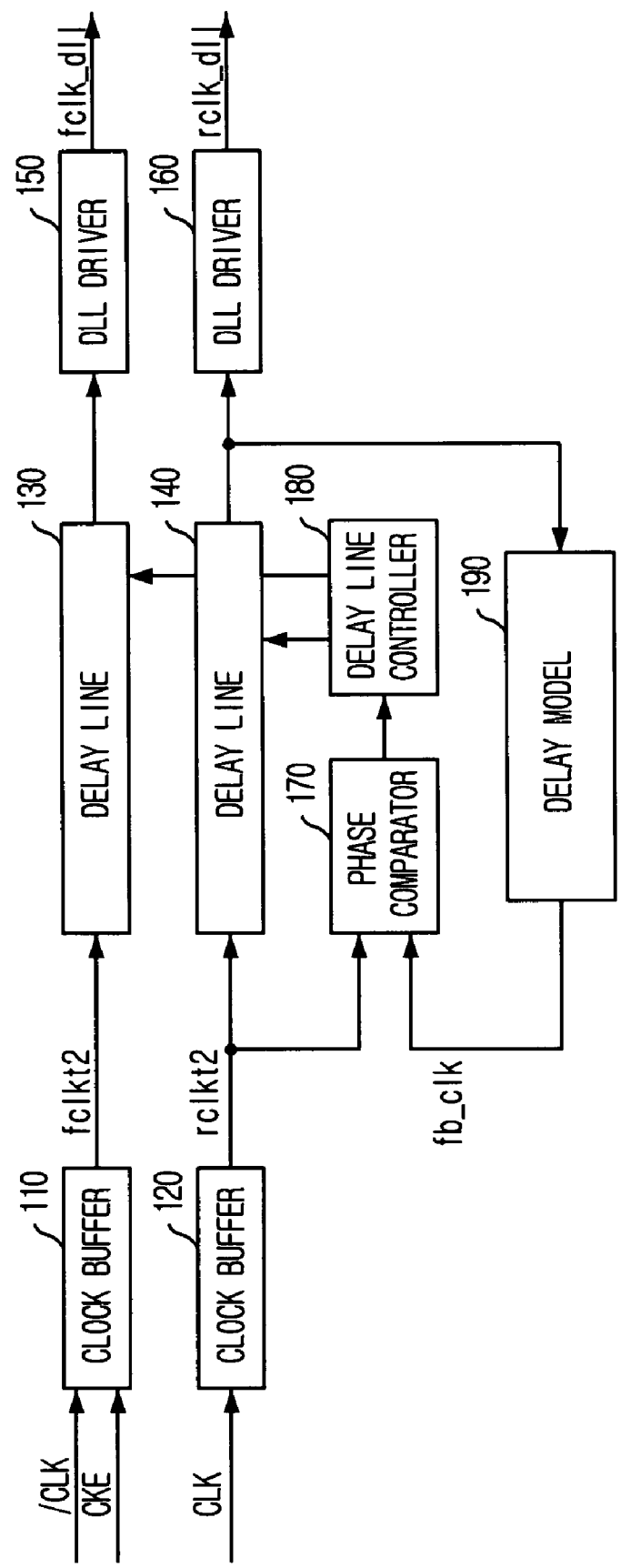
FIG. 1 is a block diagram of a delay locked loop (DLL) in a conventional DDR SDRAM.

As shown, the delay locked loop includes first and second clock buffers 210 and 220, first and second delay lines 230 and 240, a phase comparator 270, a delay line controller 280, a delay model circuit 290, and first and second DLL buffers 250 and 260, similar to the conventional DLL shown in FIG. 1. Further, the DLL in accordance with an embodiment of the present invention further includes a clock buffer controller 200 for generating a clock buffer enable signal buf_en. The clock buffer controller 200 outputs the clock buffer enable signal buf_en in response to a clock enable signal CKE and a fast mode signal fast_mode.

The fast mode signal fast_mode input to the clock buffer controller 200 is output from the phase comparator 270, for accelerating operation of the delay locked loop. According to a comparison result of the phase comparator 270, i.e., a result of comparing a phase of an internal clock rclkt2 with that of a feedback clock fb_clk, the phase comparator 200 outputs the fast mode signal fast_mode as a logic high level if a phase difference between the internal clock rclkt2 and the feedback clock fb_clk is larger than a predetermined amount; and, thus, the first and second delay lines 230 and 240 increase delay amounts of input clocks in order to rapidly reduce the phase difference. Otherwise, if a phase difference between the internal clock rclkt2 and the feedback clock fb_clk is smaller than a predetermined amount, the fast mode signal fast_mode is inactivated as a logic low level; then, until a delay locking state, the first and second delay lines make delay amounts of input clocks smaller than those in a fast mode.

When the DLL is reset after terminating a self refresh operation, the DLL operates in the fast mode. Accordingly, the fast mode signal fast_mode can be used for an indicator representing whether or not the DLL is reset.

Referring to FIG. 2, the first clock buffer 210 receives a clock bar signal/CLK to generate a first internal clock fclkt2 in response to a clock enable signal cke, and the second clock buffer 220 receives a clock signal CLK to generate a second internal clock rclkt2. The first internal clock fclkt2 is input to the first delay line 230 and the second internal clock rclkt2 is input to the second delay line 240, respectively.

The delay model circuit 290 delays an output of the second delay line 240 by a predetermined amount estimated from a clock path and data path where data or the clock signal passes on in the semiconductor memory device. The phase comparator 270 is for comparing phases of the second internal clock rclkt2 and output of the delay model circuit 290. Responsive to the comparison result of the phase comparator 270, the delay line controller 280 determines each delay amount of the first and second delay lines 230 and 240. Output of the first delay line 230 is input to the first DLL driver 250 and supplied to the semiconductor memory device as a first DLL clock fclk_dll. Likewise, output of the second delay lines 240 is input to the second DLL driver 260 and supplied as a second DLL clock rclk_dll.

The delay model circuit 290 includes a dummy clock buffer, a dummy output buffer, a dummy load, and the like, in order to implement a delay condition the same as a clock path in the semiconductor memory device. Generally, the delay model circuit 290 is called a replica circuit.

Figure 3:
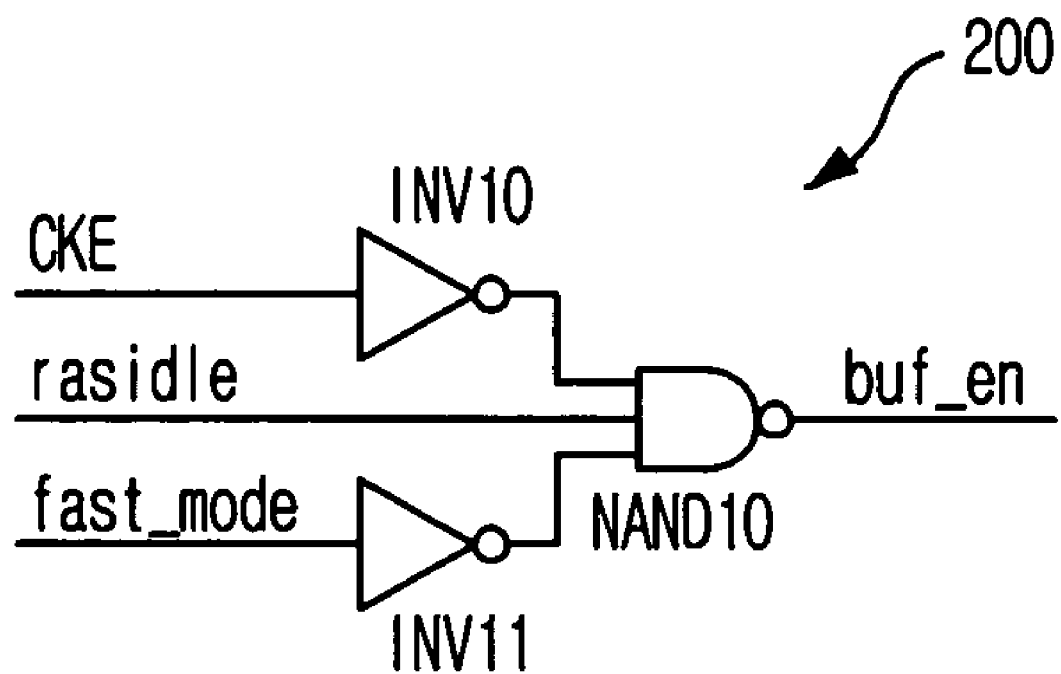
FIG. 3 is a schematic circuit diagram of a clock buffer controller shown in FIG. 2.

FIG. 3 is a schematic circuit diagram of a clock buffer controller 200 shown in FIG. 2.

As shown, the clock buffer controller 200 includes a first inverter INV10 for receiving the clock enable signal cke, a second inverter INV11 for receiving the fast mode signal fast_mode, and a logic NAND gate NAND10 for receiving a RAS idle signal rasidle and outputs of the first and second inverters INV10 and INV11 to thereby output a result of logic NAND operation.

Herein, the RAS idle signal rasidle is a signal having a logic high level when a row operation of the semiconductor memory device is idle. In other embodiments of the present invention, only the clock enable signal CKE and the fast mode signal fast_mode except for the RAS idle signal can generate the clock buffer enable signal buf_en.

Hereinafter, operations of the DLL when the semiconductor memory device sets in the precharge power down mode after the DLL achieves the delay locking state are described. At this time, the clock enable signal CKE is a logic low level, the RAS idle signal rasidle is a logic high level, and the fast mode signal fast_mode is a logic low level. Therefore, the clock buffer enable signal buf_en becomes inactivated as a logic low level, and the second clock buffer 220, controlled by the clock buffer enable signal buf_en, for generating an internal clock rclkt2 as a reference clock is disabled and can protect unnecessary current consumption. Likewise, since the clock enable signal CKE is a logic low level, the first clock buffer 210 is also disabled.

In a case in which the semiconductor memory device sets in the precharge power down mode before 200 number of clock cycles after the DLL is reset after the self refresh operation is terminated, the DLL operates in a fast mode, i.e., acceleration operations for the delay locking state are performed. At this time, the fast mode signal fast_mode is activated as a logic high level. However, since the semiconductor memory device sets in the precharge power down mode, the clock enable signal CKE becomes a logic low level. Although the RAS idle signal rasidle is a logic high level, the clock buffer enable signal buf_en can keep a logic high level. The buffer enable signal buf_en having a logic high level supports normal operations of the DLL, i.e., operations for the delay locking state, until the fast mode signal fast_mode becomes a logic low level and, thus, can prevent the semiconductor memory device from malfunctions caused by not achieving the delay locking state.

As above described, the DLL according to the present invention can prevent the semiconductor memory device from malfunctions and minimize current consumption unnecessarily occurred when the semiconductor memory device sets in a precharge power down mode.

In the described embodiments, the DLL is preferably used for DDR SDRAM, but the DLL according to the present invention can apply to other synchronous semiconductor memory devices.

Further, the clock buffer controller according to the above described embodiment can be modified based on the kind of input signals or activation logic level of the input signals. For example, in the described embodiment, the clock enable signal CKE and the RAS idle signal rasidle are used for an indicator representing the precharge power down mode; but, in another embodiment, other control signals can show the precharge power down mode. Also, the fast mode signal fast_mode is used for an indicator whether or not the DLL is reset, but other control signals can be used for the same.

The present application contains subject matter related to the Korean patent application NOS. KR 2005-0090906 and KR 2006-49128, filed in the Korean Patent Office on Sep. 29, 2005, and on May 31, 2006 respectively, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. A delay locked loop, comprising:
   a buffer control block for generating a clock buffer enable signal in response to first and second signals, wherein the first signal represents a precharge power down mode and the second signal represents a reset of the delay locked loop;
   a clock buffering block, controlled by the clock buffer enable signal, for buffering an external clock to generate a reference clock; and
   a feedback loop for delaying the reference clock until a delay locking state to thereby output a DLL output clock,
   wherein the second signal is generated from the feedback loop.

2. The delay locked loop as recited in claim 1, wherein the first signal includes one of a clock enable signal, a RAS idle signal, and both the clock enable signal and the RAS idle signal.

3. The delay locked loop as recited in claim 2, wherein the second signal includes a fast mode signal generated from the feedback loop.

4. A delay locked loop, comprising:
   a buffer control block for generating a clock buffer enable signal in response to a clock enable signal and a fast mode signal;
   a first clock buffering block, controlled by the clock buffer enable signal, for buffering a first external clock to generate a reference clock;
   a second clock buffering block, controlled by the clock enable signal, for buffering a second external clock to generate an internal clock; and
   a feedback loop for delaying the reference clock until a delay locking state to thereby output a DLL output clock, wherein the feedback loop generates the clock enable signal and the fast mode signal.

5. The delay locked loop as recited in claim 4, wherein the buffer control block receives a RAS idle signal with the clock enable signal and the fast mode signal.

6. The delay locked loop as recited in claim 5, wherein the buffer control block includes:
   a first inverter for receiving the clock enable signal;
   a second inverter for receiving the fast mode signal; and
   a logic NAND gate for receiving the RAS idle signal and outputs of the first and second inverters to thereby output a result of logic NAND operation.

7. The delay locked loop as recited in claim 4, wherein the first external clock is a clock signal and the second external clock has an opposite phase of the first external clock.

8. A method for achieving a delay locking state of the delay locked loop, comprising the steps of:
   generating a clock buffer enable signal in response to a clock enable signal and a fast mode signal;
   buffering a first external clock in response to the clock buffer enable signal to generate a reference clock;
   buffering a second external clock in response to the clock enable signal to generate an internal clock; and
   delaying the reference clock until a delay locking state to thereby output a DLL output clock, wherein the delaying the reference clock includes the step of generating the clock enable signal and the fast mode signal.

9. A semiconductor memory device, comprising:
   a buffer control block for generating a clock buffer enable signal in response to first and second signals, wherein the first signal represents a precharge power down mode and the second signal represents a reset of the delay locked loop; and
   a delay locked loop including a clock buffering block controlled by the clock buffer enable signal,
   wherein the second signal is generated from the delay locked loop.

10. The semiconductor memory device as recited in claim 9, wherein the clock buffering block is for buffering an external clock to generate a reference clock.

11. The semiconductor memory device as recited in claim 9, wherein the first signal includes one of a clock enable signal, a RAS idle signal, and both the clock enable signal and the RAS idle signal.

12. The delay locked loop as recited in claim 9, wherein the second signal includes a fast mode signal generated from a feedback loop included in the delayed locked loop.

13. A semiconductor memory device including a delay locked loop circuit, comprising;

a clock buffering block for buffering a clock signal to generate an internal clock;

a delay locked loop for activating a fast mode if the phase difference of the internal clock and a feed back clock is lager than a predetermined amount; and a buffer control block for generating an enable signal of the clock buffering block in response to a control signal enabled during a precharge power down mode.

14. The semiconductor memory device as recited in claim 13, wherein the control signal includes one of a clock enable signal, a RAS idle signal, and both the clock enable signal and the RAS idle signal.

* * * * *